(12) United States Patent
Chen et al.

(10) Patent No.: US 9,846,759 B2
(45) Date of Patent: Dec. 19, 2017

(54) GLOBAL CONNECTION ROUTING METHOD AND SYSTEM FOR PERFORMING THE SAME

(71) Applicant: TAIWAN SEMICONDUCTOR MANUFACTURING COMPANY, LTD., Hsinchu (TW)

(72) Inventors: Sheng-Hsiung Chen, Hsinchu (TW); Jyun-Hao Chang, Hsinchu (TW); Ting-Wei Chiang, New Taipei (TW); Fong-Yuan Chang, Hsinchu (TW); I-Lun Tseng, Hsinchu (TW); Po-Hsiang Huang, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 14/813,483

(22) Filed: Jul. 30, 2015

(65) Prior Publication Data

US 2017/0032073 A1 Feb. 2, 2017

(51) Int. Cl.
*G06F 17/50* (2006.01)

(52) U.S. Cl.
CPC ................. *G06F 17/5077* (2013.01)

(58) Field of Classification Search
CPC ............. G06F 17/5077; G06F 17/5072; G06F 17/5081; G06F 17/5045; G06F 17/505; G06F 17/5068; G06F 2217/84; G06F 2217/78
USPC ........................... 716/118–119, 126, 129–130
See application file for complete search history.

(56) References Cited

U.S. PATENT DOCUMENTS

| 8,421,205 | B2 | 4/2013 | Yang |
| 8,661,389 | B2 | 2/2014 | Chern et al. |
| 8,698,205 | B2 | 4/2014 | Tzeng et al. |
| 8,788,998 | B2 * | 7/2014 | Hatamian ........... G06F 17/5072 716/119 |
| 8,826,212 | B2 | 9/2014 | Yeh et al. |
| 8,836,141 | B2 | 9/2014 | Chi et al. |

(Continued)

FOREIGN PATENT DOCUMENTS

| JP | 2006155524 | 6/2006 |
| KR | 10-2013-0129450 | 11/2013 |

(Continued)

OTHER PUBLICATIONS

Notice of Allowance dated Mar. 8, 2017 and English translation from corresponding application No. KR 10-2015-0164914.

(Continued)

*Primary Examiner* — Nghia Doan
(74) *Attorney, Agent, or Firm* — Hauptman Ham, LLP

(57) ABSTRACT

A method of global connection routing includes determining a global connection tolerance of a cell for use in a circuit layout, wherein the cell comprises a plurality of pins, and a plurality of routing tracks are defined with respect to the cell. The method further includes determining a number of blocked tracks within the cell. The method further includes comparing the global connection tolerance with the number of blocked tracks. The method further includes adjusting a location of the cell within the circuit layout if the global connection tolerance and the number of blocked tracks fail to satisfy a predetermined condition.

20 Claims, 10 Drawing Sheets

(56) References Cited

U.S. PATENT DOCUMENTS

| | | | |
|---|---|---|---|
| 2003/0023938 A1* | 1/2003 | Nagasaka | G06F 17/5068 716/113 |
| 2006/0123373 A1* | 6/2006 | Andreev | G06F 17/5072 716/122 |
| 2011/0154282 A1* | 6/2011 | Chang | G06F 17/5068 716/120 |
| 2012/0192135 A1* | 7/2012 | Gullette | G06F 17/5081 716/113 |
| 2014/0115546 A1* | 4/2014 | Wang | G06F 17/5068 716/55 |
| 2014/0215420 A1 | 7/2014 | Lin et al. | |
| 2014/0264924 A1 | 9/2014 | Yu et al. | |
| 2014/0282289 A1 | 9/2014 | Hsu et al. | |
| 2014/0325466 A1 | 10/2014 | Ke et al. | |

FOREIGN PATENT DOCUMENTS

| | | |
|---|---|---|
| KR | 20150068910 | 6/2015 |
| WO | 2012135240 | 10/2012 |
| WO | 2014070005 | 5/2014 |

OTHER PUBLICATIONS

Office Action dated Oct. 14, 2016 and English translation from corresponding application No. KR 10-2015-0164914.

\* cited by examiner

GLOBAL CONNECTION ROUTING METHOD AND SYSTEM FOR PERFORMING THE SAME

BACKGROUND

A circuit layout includes one or more standard cells which correspond to active devices having a specific functionality. Cells for active devices which are routinely repeated are often included in a cell library. These cells are called standard cells in some instances. Cells include pins, which are used to convey signals into and out of the cell. At least one pin of a cell is connected to a pin of at least one other cell in order to transfer signals between the various cells. Routing lines are provided to interconnect the pins of various cells to facilitate signal transfer between different cells to provide a desired functionality for the circuit layout.

As technology nodes decrease, flexibility for routing lines is decreased due to smaller distances between cells and between elements within cells. For example, at technology nodes of 10 nanometers or less, at least one metal level includes routing lines extending only in a single direction. This routing scheme is called one-dimensional routing in some embodiments. A metal level is a layer of conductive lines in a plane having a nearly uniform distance from a substrate. Global connections are routing lines which extend across one or more standard cells. In some instances, global connections extend across an entirety of the circuit layout. Global connections only extend in one direction for circuit layouts which include one-dimensional routing.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A-2 is a plan view of a circuit layout including a modified cell in accordance with some embodiments.

FIG. 2 is a plan view of a cell in a circuit layout in accordance with some embodiments.

DETAILED DESCRIPTION

Figures 1, 1A, 2:
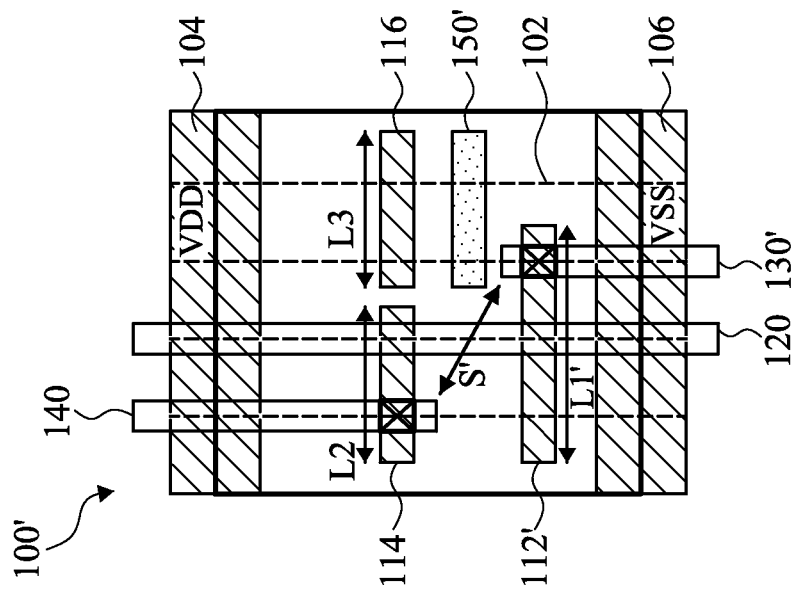
Figures 1, 1A:
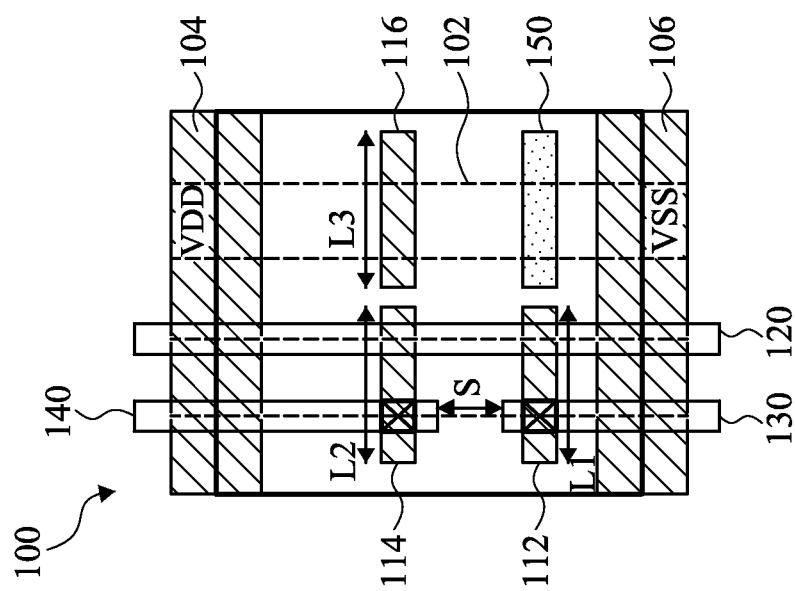
FIG. 1A-1 is a plan view of a circuit layout including a cell in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A-1 is a plan view of a circuit layout 100 including a cell in accordance with some embodiments. Circuit layout 100 includes a plurality of routing tracks 102 for a metal level. Routing tracks 102 in FIG. 1A-1 are indicated as broken lines for clarity. Only one routing track 102 is labeled for clarity. Routing tracks 102 extend parallel to one another because the metal level uses a one-dimensional routing scheme. Circuit layout 100 includes a supply voltage (VDD) bus 104 extending perpendicular to routing tracks 102. A reference voltage (VSS) bus 106 extends perpendicular to routing tracks 102 on an opposite side of circuit layout 100 from VDD bus 104. The cell includes a plurality of pins 112, 114 and 116 located between VDD bus 104 and VSS bus 106 and extending perpendicular to routing tracks 102. A first pin 112 has a length L1. A second pin 114 has a length L2. A third pin 116 has a length L3. VDD bus 104, VSS bus 106, pin 112, pin 114, and pin 116 are located on the same metal level. In some embodiments, VDD bus 104, VSS bus 106, pin 112, pin 114 and pin 116 are on a metal level closest to a substrate, which is called a first metal level. Circuit layout 100 further includes a global connection 120 extending across an entirety of the standard cell along a routing track 102. Global connection 120 is located on a metal level farther from a substrate of the circuit layout than pins 112, 114, and 116. In some embodiments, a second metal level farther from the substrate than a first metal level is described as being "above" the first metal level. A first local connection 130 extends parallel to global connection 120 and connects to first pin 112 by a via. First local connection 130 is on a same metal level as global connection 120. A second local connection 140 extends parallel to global connection 120 and connects to second pin 114 by a via. Second local connection 140 is on a same metal level as global connection 120 and first local connection 130. In some embodiments, global connection 120, local connection 130, and local connection 140 are located on the second metal level. Vias which provide connections between different metal levels are labeled with 'X' in circuit layout 100. Vias are able to be located at access points. An access point is a location where a pin, e.g., pin 112, intersects with a routing track 102. These access points are located where local connections, e.g., first local connection 130 or second local connection 140, or global connections, e.g., global connection 120, extend above a pin. Second local connection 140 is located on a same routing track 102 as first local connection 130. An end-to-end separation S between first local connection 130 and second local connection 140 is less than a minimum separation distance for circuit layout 100. The cell also includes internal wiring 150, which is located on a same metal level as VDD bus 104, VSS bus 106, pin 112, pin 114 and pin 116, and is used to provide internal connections within the cell.

In some embodiments, the cell of circuit layout 100 is a standard cell retrieved from a cell library. Pins 112, 114 and 116 provide connection points to transfer signals into and/or out of the cell. In some embodiments, global connection 120 is electrically connected to at least one of pins 112, 114 or 116. In some embodiments, global connection 120 is connected to every pin 112, 114 and 116. In some embodiments, global connection 120 is not connected to any of pins 112, 114 or 116. In some embodiments, global connection 120 is configured to carry a global signal such as a global clock signal, a supply voltage signal, a reference voltage signal or another suitable global signal. A global signal is a signal which has substantially a same value usable by multiple cells in a circuit layout. In some embodiments, the global signal is supplied to less than all cells in circuit layout 100.

First local connection 130 is configured to carry a local signal to pin 112. A local signal is a signal having a specific value intended for a specific cell and a specific pin or pins within the cell. In some embodiments, the local signal is an output from another cell, an input for another cell, a local clock signal or another suitable local signal.

Second local connection 140 is configured to carry a local signal to pin 114. End-to-end separation S between first local connection 130 and second location connection 140 is less than the minimum separation distance for circuit layout 100, which means that the first local connection and the second location connection cannot be reliably formed in the location indicated in circuit layout 100. The minimum separation distance is related to a process technology used to form circuit layout 100. The minimum separation distance is based on patterning processes, formation processes and inherent manufacturing offset. In some embodiments, the minimum separation distance is a value set defined in a technology file used by an automatic placement and routing (APR) tool. The APR tool performs design rule checking (DRC) in order to determine whether the minimum separation distance and other design rules are satisfied by elements within circuit layout 100. In the situation of circuit layout 100, the APR tool would indicate an error due to the end-to-end separation S between first local connection 130 and second location connection 140.

In some embodiments, first local connection 130 and second local connection 140 cannot be located in a routing track 102. If first local connection 130 and second local connection 140 are in a routing track 102, manufacturing circuit layout 100 has an increased risk of resulting in a faulty circuit.

Figure 1B:
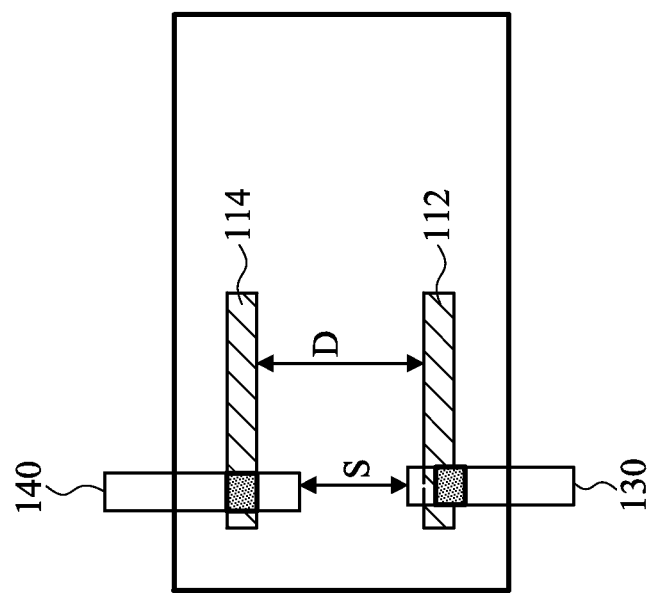
FIG. 1B is an enlarged plan view of a cell in accordance with some embodiments.
Figure 2:
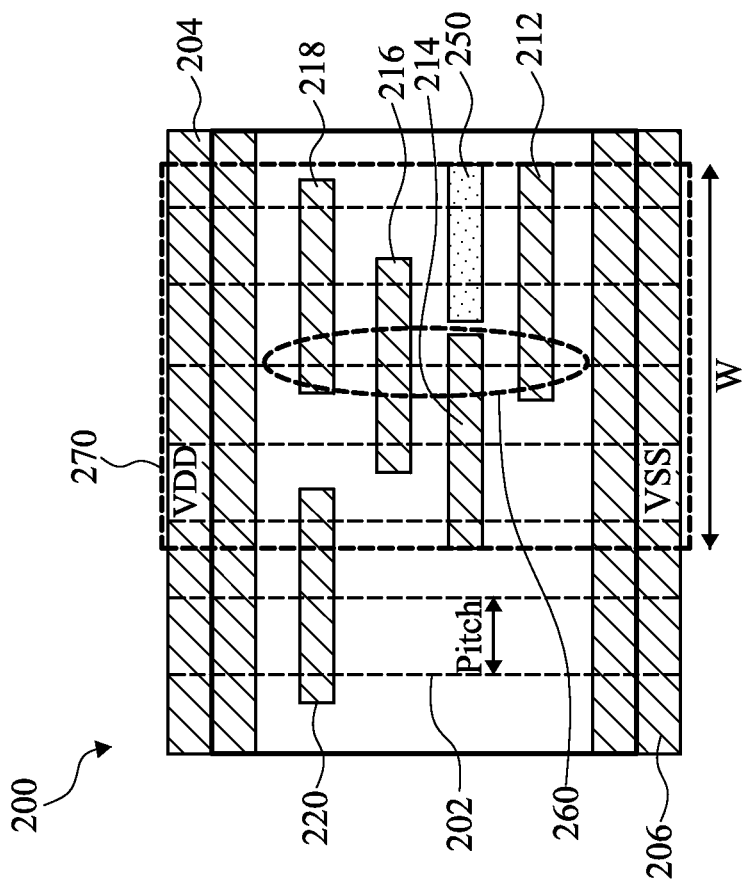

FIG. 1B is an enlarged plan view of a cell in accordance with some embodiments. The cell includes elements from circuit layout 100 (FIG. 1A-1). Same elements have a same reference number. A distance D between first pin 112 and second pin 114 is greater than the minimum separation distance for the metal level. However, if distance D between adjacent pins 112 and 114 of the cell is small, first local connection 130 and second local connection 140 cannot be formed in a same routing track 102 without violating the minimum separation distance design rule.

Returning to FIG. 1A-1, either first local connection 130 or second local connection 140 should be moved to a different routing track 102 in order to facilitate reliable manufacturing of circuit layout 100. However, moving either first local connection 130 or second local connection 140 to another routing track 102 would include modification of a standard cell layout. The modification of the standard cell layout would occur because pin 112 is connected to a local connection 130 which is on the second metal level from one of the two access points, i.e., the two locations where pin 112 and routing tracks 102 intersect, and pin 114 is connected to a local connection 140 which is on the second metal level from one of the two access points, i.e., the two locations where pin 114 and routing tracks 102 intersect. However, one access point of pin 112 and one access point of pin 114 are blocked by global connection 120. In addition, local connections 130 and 140 cannot be located on the same track due to spacing issues discussed above. As a result, the layout of the standard cell is modified in order to facilitate routing to the cell. Therefore, in order to resolve the end-to-end separation S error in circuit layout 100, a length of at least one pin in circuit layout 100 is modified, in some embodiments.

FIG. 1A-2 is a plan view of the circuit layout 100' including a modified cell in accordance with some embodiments. Circuit layout 100' includes several elements which are the same as elements from circuit layout 100. Same elements have a same reference number. Elements of circuit layout 100' which are modified with respect to circuit layout 100 have a same reference number appended by a prime (') symbol.

In comparison with circuit layout 100, circuit layout 100' includes first pin 112' having a length increased from L1 to L1'. A location of local connection 130' is different from a location of local connection 130 in circuit layout 100. The increased length of first pin 112' increases a number of access points for first pin 112' to three, in comparison with two access points in circuit layout 100. By changing a location of first local connection 130', first local connection 130' and second local connection 140 satisfy design rules. The increase in the distance between first local connection 130' and second local connection 140 means that circuit layout 100' is able to be reliably manufactured. In some embodiments, second local connection 140 is moved to a different routing track 102 and first local connection 130' remains in a same routing track 102 as in circuit layout 100. In some embodiments, length L1 of first pin 112 is maintained as a same length in circuit layout 100' as in circuit layout 100. In some embodiments, length L2 of second pin 114 is adjusted in comparison with circuit layout 100.

Absent an ability to modify pins in circuit layout 100, which contains global connection 120, the cell would be unusable. In some embodiments, an unusable cell is called a dead cell. As a number of dead cells within a circuit layout increases, a utilization of the circuit layout decreases. The utilization of a circuit layout is based on a ratio between a total area of cells within a circuit layout and an overall area of the circuit layout. Increasing utilization of a circuit layout helps to facilitate overall size reduction of the circuit layout.

FIG. 2 is a plan view of a cell in a circuit layout 200 in accordance with some embodiments. Circuit layout 200 includes similar elements as circuit layout 100. Same elements have a same reference number increased by 100. In comparison with circuit layout 100, circuit layout 200 includes a fourth pin 218, and a fifth pin 220. FIG. 2 also includes an overlap region 260 and a span region 270. Overlap region 260 is a routing track 202 where a greatest number of pins extend entirely across a routing track 202, e.g., pins 212, 214, 216, and 218. In some embodiments, overlap region 260 is called a maximum overlap region. Overlap region 260 is a candidate location for a global connection, e.g., global connection 120 (FIG. 1A-1). In some embodiments, pins 212, 214, 216 and 218 which occupy overlap region 260 are called a maximum overlapped pin group.

In order to help maintain usability of the cell in circuit layout 200, a span width W from a left most pin location of the maximum overlapped pin group to a right most pin location of the maximum overlapped pin group should be at least equal to a minimum span width. For example, in FIG. 2, the span width W is a width of span region 270. Pin 220 is not considered for span width W of span region 270 because pin 220 is not included in overlap region 260. The minimum span width helps to ensure that at least one global connection is able to be included in the circuit layout as well as any local connections used by the circuit layout. Increasing the minimum span width increases a number of routing solutions for defining a usable cell. As a number of routing solutions increases, an amount of time for an APR tool to identify a suitable routing scheme decreases. However, increasing the minimum span width also increases a size of the cell and the overall circuit layout. The minimum span width is based in part on a number of pins in the maximum overlapped pin group. As a number of pins in the maximum overlapped pin group increases, the minimum span width also increases.

Circuit layout 200 includes four pins 212, 214, 216 and 218 in the maximum overlapped pin group. In some embodiments, the span width W for circuit layout 200 is at least 278 nanometers (nm). In some embodiments where circuit layout includes three pins in the overlapped pin group, the span width W is at least 234 nm. In some embodiments where circuit layout includes two pins in the overlapped pin group, the span width W is at least 190 nm. In some embodiments where circuit layout includes one pin in the overlapped pin group, the span width W is at least 146 nm. In some embodiments, the minimum span width differs from the above values. The minimum span width is adjustable based on a pitch of routing tracks 202, dimensions of via cuts, an enclosure distance between a via cut and a metal wire, a number of pins in a maximum overlapped pin group, a number of local connections, and other suitable variables.

A global connection tolerance K defines a maximum number of global connections that can be placed across a standard cell. The global connection tolerance K is determined based on a difference between a number of routing tracks in a span region and a number of pins in a maximum overlapped pin group. The global connection tolerance K should be either zero or a positive integer; otherwise, when K is less than zero, the pins in the span region cannot be routed even when a global connection does not exist. The number of routing tracks in a span region is determined based on a difference between an index of a rightmost track and an index of a leftmost track increased by one. For example, circuit layout 200 includes four pins in the maximum overlapped pin group in overlap region 260. A number of routing tracks in the span region is five. As a result, a global connection tolerance K for circuit layout 200 is one.

A global connection tolerance K greater than zero indicates that the cell layout is capable of receiving a global connection. As the global connection tolerance K increases, routing options for the cell layout increase which increases flexibility of the cell layout in various circuit designs.

Figure 3:
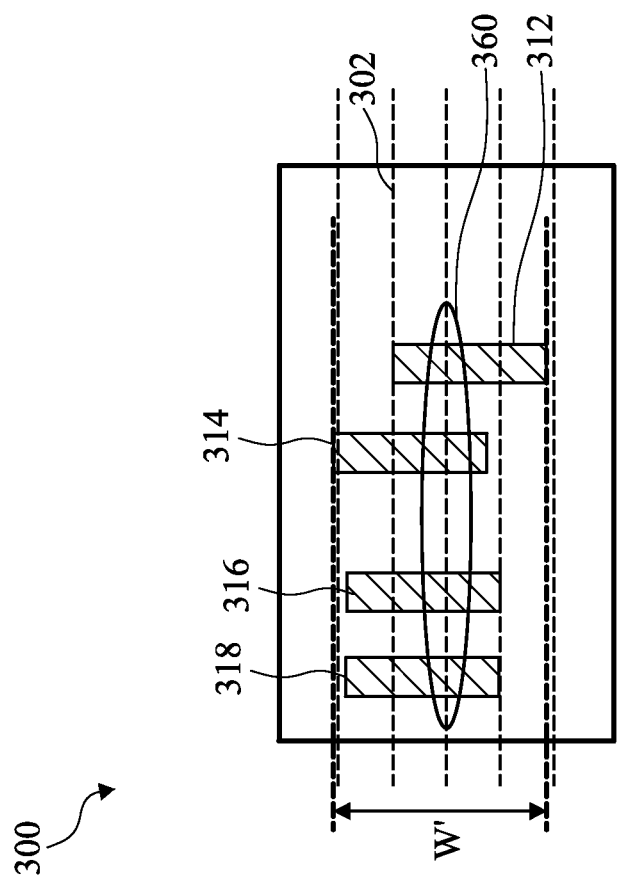
FIG. 3 is a plan view of a cell in a circuit layout in accordance with some embodiments.

FIG. 3 is a plan view of a cell in a circuit layout 300 in accordance with some embodiments. Circuit layout 300 includes similar elements as circuit layout 200. Same elements have a same reference number increased by 100. In comparison with circuit layout 200, circuit layout 300 includes pins oriented in a vertical direction in the plan view. Routing tracks 302 extend in a horizontal direction, perpendicular to pins 312, 314, 316 and 318. Overlap region 360 also extends in the horizontal direction. Circuit layout 300 includes a span width W'. Regardless of an orientation of pins, i.e., extending in a vertical direction or in the horizontal direction, span width W' is still at least equal to the minimum span width. That is, an orientation of pins in a circuit layout does not impact the minimum span width. In some embodiments, circuit layout 100 (FIG. 1A-1), circuit layout 100' (FIG. 1A-2) or circuit layout 200 (FIG. 2) is modified to have pins extending in the vertical direction.

Figure 4A:
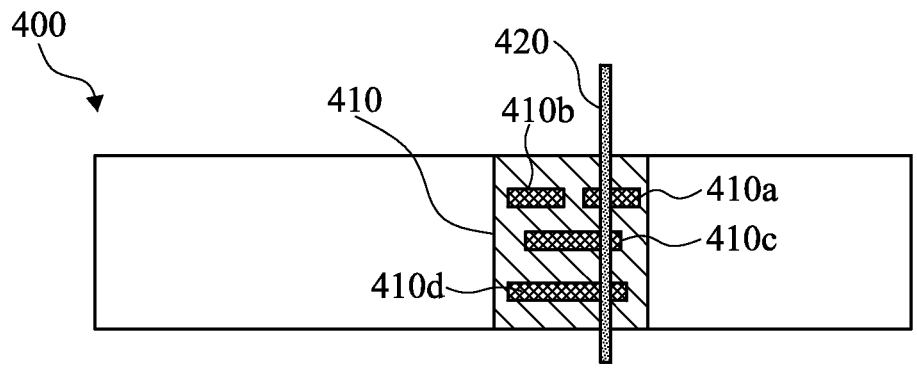
FIG. 4A is a plan view of a circuit layout including a cell and a blocking shape in accordance with some embodiments.

FIG. 4A is a plan view of a circuit layout 400 including a cell 410 and a blocking shape 420 in accordance with some embodiments. Circuit layout 400 includes cell 410 which includes a plurality of pins 410a-d. Pins 410a-d are located on a first metal layer and blocking shape 420 is located on a second metal layer over cell 410. Blocking shape 420 is over an overlap region of pins 410a, 410c and 410d. Due to the location of blocking shape 420, at least one routing track, e.g., routing track 102 (FIG. 1), is unavailable for global or local connections to pins 410a, 410c, and 410d. To increase a number of routing solutions for cell 410, an APR tool is usable to adjust a location of cell 410 within circuit layout 400. For example, the APR tool adjusts the location of cell 410 in a direction perpendicular to blocking shape 420, in some embodiments.

In some embodiments, blocking shape 420 is a type of a global connection. In some embodiments, blocking shape 420 is a power-ground line. In some embodiments, blocking shape 420 is another interconnect structure within circuit layout 400. In some embodiments, a location of blocking shape 420 prevents routing of a global or a local connection to cell 410. To increase a number of routing solutions for circuit layout 400, lengths of pins 410a-d are adjusted in some embodiments. In some embodiments, a location of cell 410 is adjusted within circuit layout 400 in order to reduce the impact of blocking shape 420 or avoid the blocking shape entirely.

Figure 4B:
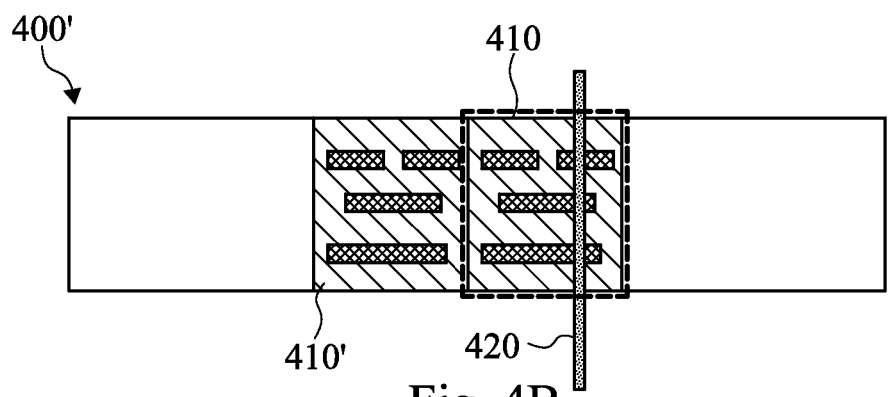
FIG. 4B is a plan view of a circuit layout including two cells and a blocking shape in accordance with some embodiments.

FIG. 4B is a plan view of a circuit layout 400' including a cell 410 and a blocking shape 420 in accordance with some embodiments. In comparison with circuit layout 400, circuit layout 400' includes cell 410' which is a neighboring cell adjacent to cell 410. Routing local connections or global connections in cell 410' impacts routing solutions for cell 410 due to the proximity between cell 410 and cell 410', in some embodiments. For example, there are not sufficient routing resources on a third metal level, in some instances.

Figure 4C:
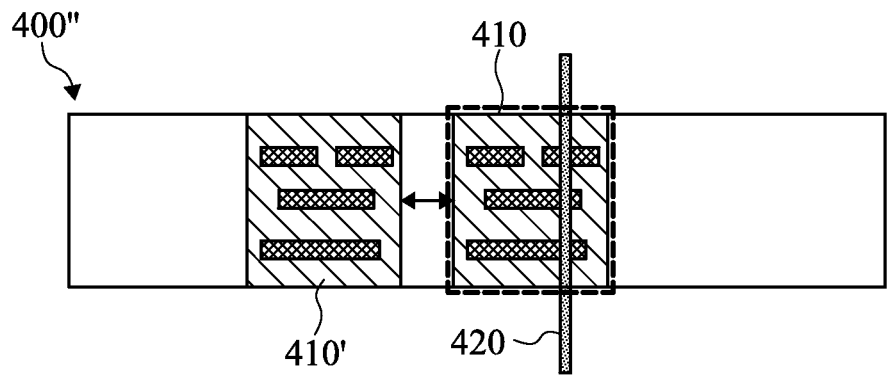
FIG. 4C is a plan view of a circuit layout including two cells and a blocking shape in accordance with some embodiments.

FIG. 4C is a plan view of a circuit layout 400" including a cell 410 and a blocking shape 420 in accordance with some embodiments. In comparison with circuit layout 400', circuit layout 400" includes cell 410' located at a position away from cell 410. Increasing a distance between cell 410 and cell 410' increases the number of routing solutions for circuit layout 400" in comparison with circuit layout 400'. For example, increasing the distance provides more routing resources for the first metal level and the third metal level.

Figure 5A:
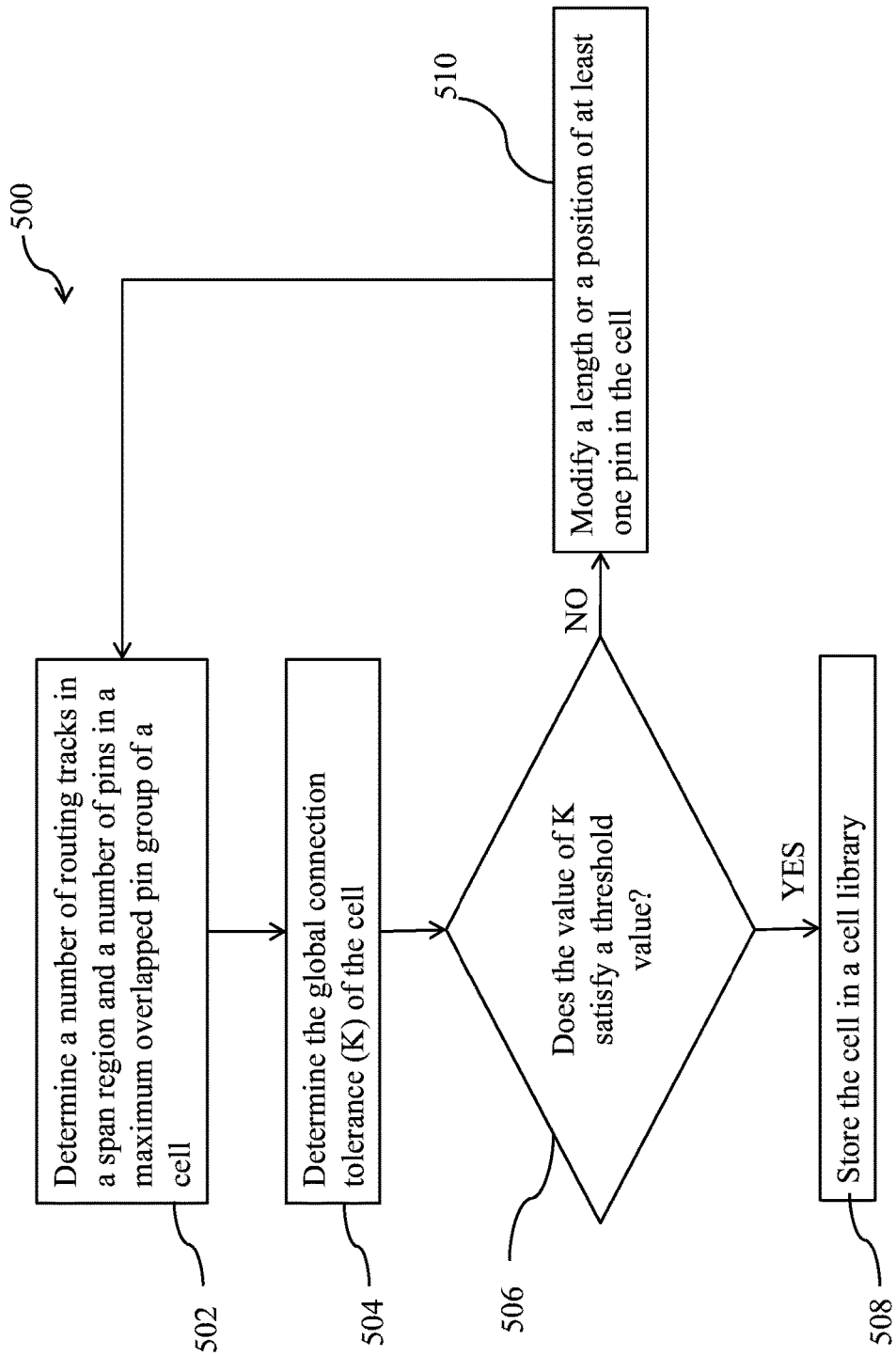
FIG. 5A is a flow chart of a method of modifying a cell based on global connection routing in accordance with some embodiments.

FIG. 5A is a flow chart of a method of modifying a cell based on global connection tolerance in accordance with some embodiments. In operation 502, a number of routing tracks in a span region and a number of pins in a maximum overlapped pin group of a cell are identified. In some embodiments, the number of pins in the maximum overlapped pin group is determined by using a design tool. In some embodiments, the number of pins in the maximum overlapped pin group is received from a user.

In operation 504, a global connection tolerance K of the cell is determined. The global connection tolerance K is determined based on a number of pins in a maximum overlapped pin group of the cell and on a number of routing tracks within a span region of the cell. The number of routing tracks in the span region is determined based on a difference between an index of a rightmost track and an index of a leftmost track increased by one. FIGS. 2 and 3 above provide examples of how a number of pins in a maximum overlapped pin group is determined as well as how a number of routing tracks in a span region is determined, in some embodiments.

In comparison 506, the global connection tolerance K is compared with a threshold value. The threshold value is a desired global connection tolerance. In some embodiments, the threshold value is retrieved from a look-up table. In some embodiments, the threshold value is calculated based on the parameters of an integrated circuit. In some embodiments, the threshold value is provided by a user.

If the comparison 506 determines that the global connection tolerance K satisfies the threshold value, method 500 continues to operation 508 in which the cell is stored in a cell library. In some embodiments, the cell is associated with a global connection tolerance value. In some embodiments, the cell is stored without being associated with a global connection tolerance value. In some embodiments, the cell library is usable by a circuit designer for designing a circuit layout.

If the comparison 506 determines that the global connection tolerance K fails to satisfy the threshold value, method 500 continues with operation 510 in which a length of at least one pin of the cell is adjusted or a position of at least one pin in the cell is adjusted. In some embodiments, operation 510 includes only adjusting the length of at least one pin of the cell. In some embodiments, operation 510 includes only adjusting the position of at least one pin of the cell. In some embodiments, operation 510 includes both adjusting the length of at least one pin of the cell and adjusting the position of at least one pin of the cell. In some embodiments, a length of a first pin is adjusted in operation 510 and a position of a second pin, different from the first pin, is adjusted in operation 510. In some embodiments, a length and a position of a same pin are adjusted in operation 510.

The length of at least one pin of the cell is adjusted as described above with respect to FIGS. 1A-1 and 1A-2. In some embodiments, a length of every pin in the cell is adjusted. In some embodiments, a length of less than every pin in the cell is adjusted. Adjusting the length of at least one pin in the cell increases locations for connection to the pin having the adjusted length. As a result, a global connection tolerance of the cell is changed, in some instances. Following operation 510, method 500 returns to operation 502 to determine a number of routing tracks in a span region and a number of pins in a maximum overlapped pin group of the modified cell.

Figure 5B:
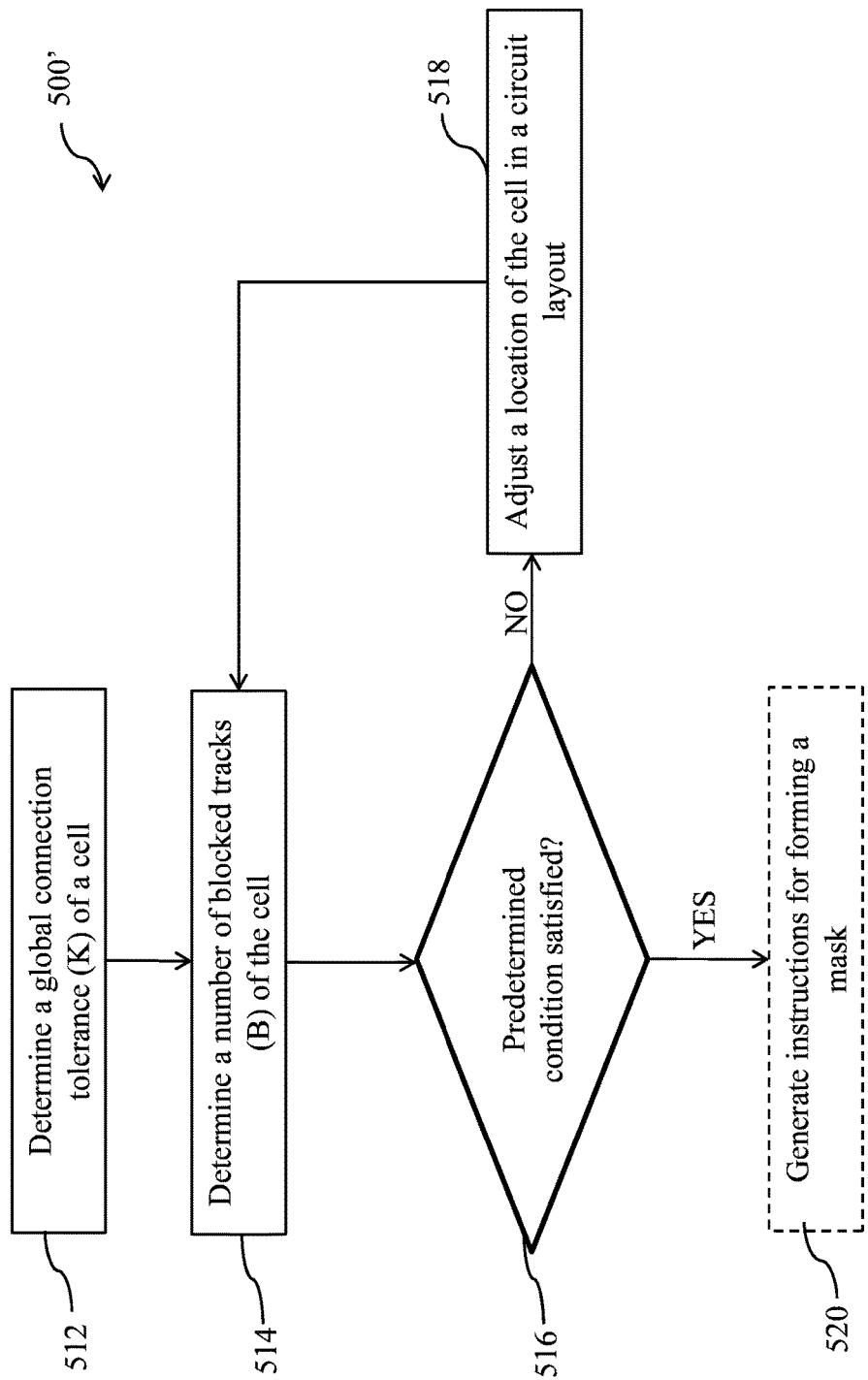
FIG. 5B is a flow chart of a method of designing a circuit layout based on global connection routing in accordance with some embodiments.

FIG. 5B is a flow chart of a method 500' of designing a circuit layout based on global connection routing in accordance with some embodiments. In operation 512, a global connection tolerance (K) of a cell is determined. The global connection tolerance K should be either zero or a positive integer number. The global connection tolerance K of a cell is the ability of a cell to tolerate global connections. A global connection tolerance K greater than zero indicates that the cell is not a dead cell, i.e., the cell is capable of allowing at least one global connection extending across the cell. A high global connection tolerance K indicates that the cell has a large number of possible routing solutions for accessing pins within a cell when only one global connection passes the cell, which increases the likelihood of a routing solution for the cell which renders the cell usable. In some embodiments, the global connection tolerance K is determined based on a value stored in a cell library associated with the cell. In some embodiments, the global connection tolerance K is determined by identifying a span region for a maximum overlapped pin group; identifying a routing track closest to a first edge of the cell usable to connect to a pin of the cell; identifying a routing track closest to a second edge of the cell, opposite the first edge of the cell, usable to connect to a pin of the cell; and identifying a number of pins in the cell. In some embodiments where the cell includes pins extending horizontally, the global connection tolerance K is determined by identifying a left most routing track usable to connect to a pin of the cell; identifying a right most routing track usable to connect to a pin of the cell; and identifying a number of pins in the cell. In some embodiments where the cell includes pins extending vertically, the global connection tolerance K is determined by identifying a top most routing track usable to connect to a pin of the cell; identifying a bottom most routing track usable to connect to a pin of the cell; and identifying a number of pins in the cell.

Figure 6:
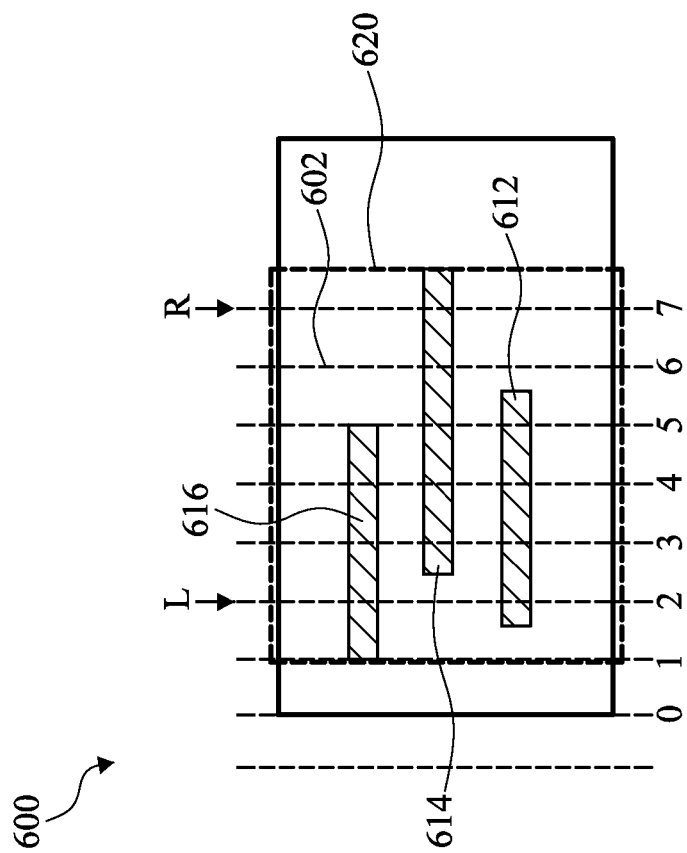
FIG. 6 is a plan view of a cell including pins in accordance with some embodiments.

An example of how a global connection tolerance K is calculated is provided based on an example cell in FIG. 6. FIG. 6 is a plan view of a cell 600 including pins 612-616 in accordance with some embodiments. FIG. 6 includes cell 600 with a plurality of routing tracks 602 for a higher metal level superimposed over the cell. Each of the routing tracks includes an index, the index begins at zero for a routing track on an edge of cell 600 in the given embodiment. A span region 620 of cell 600 indicates a span of a maximum overlapped pin group, i.e., pins 612, 614 and 616. In the example of cell 600 an index of a right most routing track usable to connect to a pin in the span region of cell 600 is "7." Pin 614 extends entirely through a routing track 602 having the index of "7." A left most routing track usable to connect to a pin in the span region of cell 600 is "2." While pin 616 extends into routing track 602 having the index of "1," pin 616 extends across less than the entirety of the index "1" routing track. Therefore, connecting to pin 616 in routing track "1" will present issues with decreased manufacturing reliability. As a result, the left most routing track usable for connecting to pin 616 is routing track "2." A number of pins in a maximum overlapped pin group of cell 600 is 3, pins 612-616. Based on the information given above, a global connection tolerance of cell 600 is 3.

While cell 600 includes pins extending horizontally, methods 500 and 500' are also applicable to cells having pins extending vertically.

In operation 514 of method 500', a number of blocked tracks B of the cell is determined. Similar to FIGS. 4A-4C, blocking shapes located on a metal level above pins of the cell prevent connection to the pins. The number of blocked tracks B is determined based on a pin blocking shape group.

Figure 7:
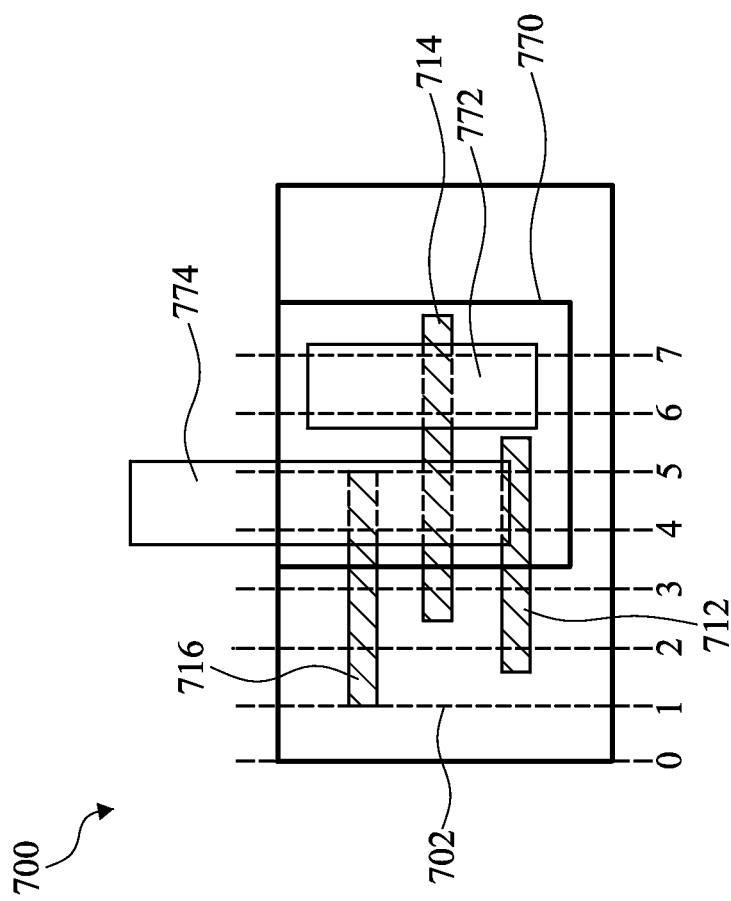
FIG. 7 is a plan view of a cell including pins and blocking shapes in accordance with some embodiments.

An example of how a number of blocked tracks B is calculated is provided based on an example cell in FIG. 7. FIG. 7 is a plan view of a cell 700 including pins 712-716 and blocking shapes 772 and 774 in accordance with some embodiments. Cell 700 is similar to cell 600. Same elements have a same reference number increased by 100. In comparison with cell 600, cell 700 includes a pin blocking shape group 770 that blocks a number of routing tracks 702. Pin blocking shape group 770 includes a first blocking shape 772 and a second blocking shape 774. Blocking shapes 772 and 774 are located on a metal level above pins of the cell. In some embodiments, first blocking shape 772 or second blocking shape 774 is independently selected from power-ground lines or other interconnect structures.

Pin blocking shape group 770 extends across four routing tracks, routing tracks "4," "5," "6," and "7." Therefore, a number of blocked tracks in cell 700 is four. In some embodiments, pin blocking shape group 770 includes a single blocking shape. In some embodiments, pin blocking shape group 770 includes more than two blocking shapes.

Returning to FIG. 5B, method 500' continues with comparison 516. In comparison 516, the global connection tolerance K of the cell is compared with the number of blocked tracks B of the cell. If the global connection tolerance K is less than the number of blocked tracks B, the cell will be unusable, i.e., a dead cell. The cell will be unusable because there will be no routing scheme solution for the cell due to the large number of blocked routing tracks of the cell relative to the small number of connection points for the cell.

If the global connection tolerance K of the cell is less than the number of blocked tracks B of the cell (meaning a predetermined condition is not satisfied), then method 500' continues to operation 518 in order to modify a location of the cell in the circuit layout. In some embodiments, the predetermined condition is the global connection tolerance K being less than the number of blocked tracks B. In some embodiments, one or more additional buffers which are close to the cell are inserted into the circuit layout in order to adjust a location of the cell. However, providing one or more desired buffers will also increase a size of the overall circuit layout, in some instances. Also, the use of desired buffers will increase a number of feedbacks from comparison 516 to operation 518, in some instances.

The location of the cell is adjusted as described above with respect to FIGS. 4A-4C. In some embodiments, the location of the cell is adjusted to change a location of a blocking shape relative to the cell. In some embodiments, the location of the cell is adjusted to locate the cell completely separate from the blocking shape.

Following operation 518, method 500' returns to operation 514 to determine a number of blocked tracks B for the modified cell location.

If the global connection tolerance K and the number of blocked tracks B satisfy the predetermined condition, then method 500' continues to optional operation 520. In some embodiments, if the global connection tolerance K is equal to or greater than the number of blocked tracks B, then method 500' continues to optional operation 520. In optional operation 520, instructions for forming a mask based on the circuit layout are generated. In some embodiments, operation 520 is omitted if there are other cells which need to be checked for the predetermined condition. In some embodiments, operation 520 is omitted if the mask is to be formed by a different entity from the one generating the circuit layout. A mask is used in a lithography process in order to pattern a wafer to form the device in the substrate. In some embodiments, the instructions for forming the mask are generated using a same tool as that used to analyze and modify the circuit layout. In some embodiments, the instructions for forming the mask are generated by using a different tool from that used to analyze and modify the circuit layout. In some embodiments, additional operations are performed prior to generating the instructions for forming the mask. In some embodiments, the additional operations include a layout-versus-schematic (LVS) check, a design rules check (DRC), a simulation of the resistance-capacitance (RC) performance of the circuit layout, or other suitable operations.

In some embodiments, additional operations are included in method 500', such as LVS check, DRC, RC simulation, or other suitable operations. In some embodiments, an order of operations for method 500' is modified. In some embodiments, multiple operations for method 500' are performed simultaneously. For example, in some embodiments, operation 514 and operation 518 are performed simultaneously. In some embodiments, operations from method 500 (FIG. 5A) are combined with operations from method 500'. For example, in some embodiments, method 500' alters a length of a pin or a location of a pin within a cell to adjust a global connection tolerance K similar to operation 510 in method 500.

Figure 8:
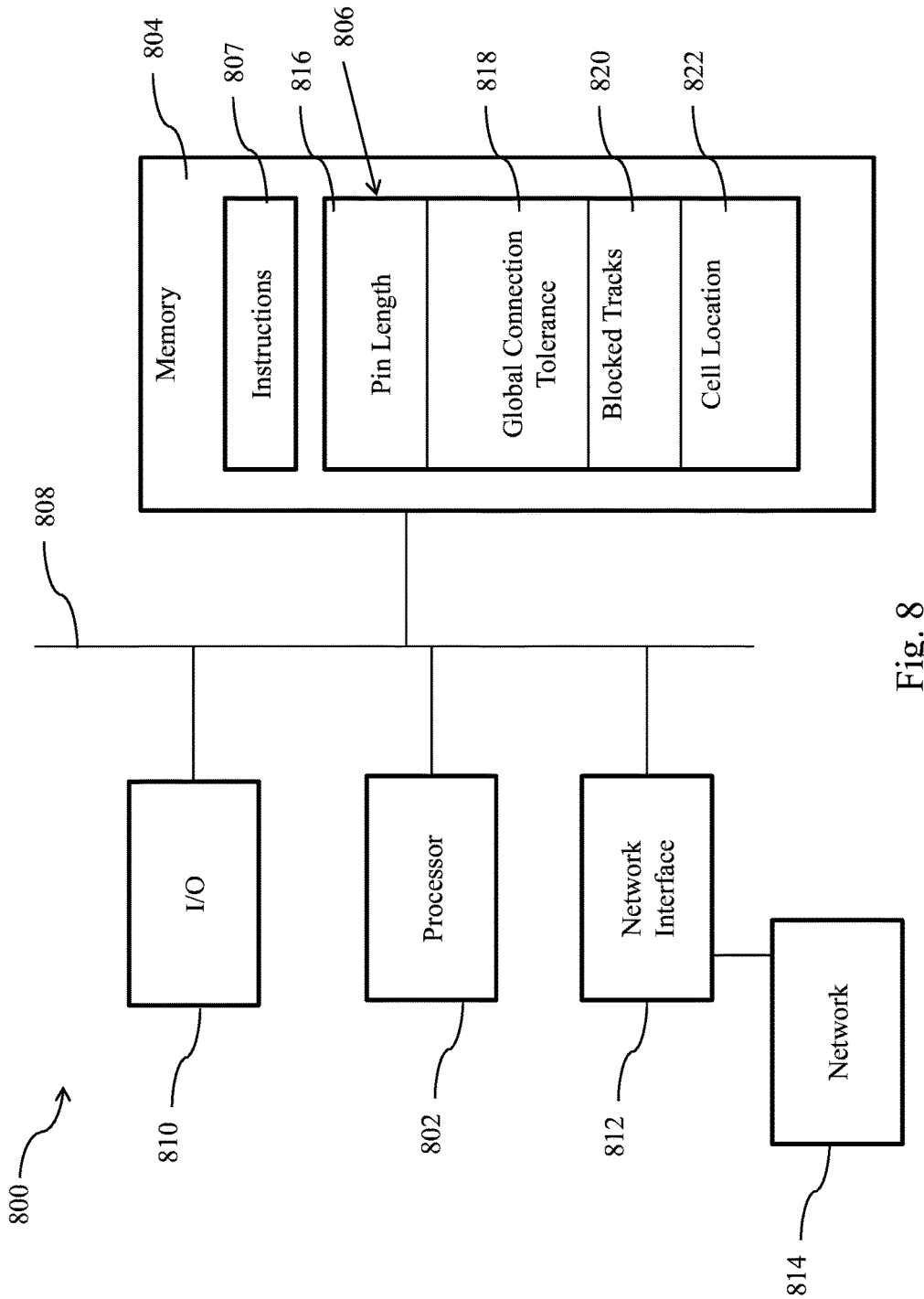
FIG. 8 is a schematic diagram of a specific purpose system for implementing a method of global connection routing in accordance with some embodiments.

FIG. 8 is a schematic diagram of a specific purpose system for implementing a method of global connection routing in accordance with some embodiments. System 800 includes a hardware processor 802 and a non-transitory, computer readable storage medium 804 encoded with, i.e., storing, the computer program data 806, i.e., a set of program variables. Computer readable storage medium 804 is also encoded with instructions 807 for interfacing with other machines and for implementing a method of global connection routing, e.g., method 500 or method 500' (FIGS. 5A and 5B). The processor 802 is electrically coupled to the computer readable storage medium 804 via a bus 808. The processor 802 is also electrically coupled to an I/O interface 810 by bus 808. A network interface 812 is also electrically connected to the processor 802 via bus 808. Network interface 812 is connected to a network 814, so that processor 802 and computer readable storage medium 804 are capable of connecting to external elements via network 814. The processor 802 is configured to execute the computer program code 806 or 807 encoded in the computer readable storage medium 804 in order to cause system 800 to be usable for performing a portion or all of the operations as described in method 500 or method 500' (FIGS. 5A and 5B). During execution of method 500 or method 500', additional information is stored in or read from memory 804, in some embodiments.

In some embodiments, the processor 802 is a central processing unit (CPU), a multi-processor, a distributed processing system, an application specific integrated circuit (ASIC), and/or a suitable processing unit.

In some embodiments, the computer readable storage medium 804 is an electronic, magnetic, optical, electromagnetic, infrared, and/or a semiconductor system (or apparatus or device). For example, the computer readable storage medium 804 includes a semiconductor or solid-state memory, a magnetic tape, a removable computer diskette, a random access memory (RAM), a read-only memory (ROM), a rigid magnetic disk, and/or an optical disk. In some embodiments, the computer readable storage medium 804 includes an optical disk, such as a compact disk-read only memory (CD-ROM), a compact disk-read/write (CD-R/W), and/or a digital video disc (DVD).

In some embodiments, the storage medium 804 stores the computer program code 806 or 807 configured to cause system 800 to perform method 500 or method 500' (FIGS. 5A and 5B). In some embodiments, the storage medium 804 also stores information needed for performing a method 500 or method 500' (FIGS. 5A and 5B) as well as information generated during performing the method 500 or method 500', such as a pin length parameter 816, a global connection tolerance parameter 818, a blocked tracks parameter 820, a cell location parameter 822, and/or a set of executable instructions to perform the operation of method 500 or method 500' (FIGS. 5A and 5B).

In some embodiments, the storage medium 804 stores instructions 807 for interfacing with manufacturing machines. The instructions 807 enable processor 802 to generate manufacturing instructions readable by the manufacturing machines to effectively implement method 500 or method 500' (FIGS. 5A and 5B) during a global connection routing process. During execution of method 500 or method 500', additional information is stored in or read from memory 804, in some embodiments.

System 800 includes I/O interface 810. I/O interface 810 is coupled to external circuitry. In some embodiments, I/O interface 810 includes a keyboard, keypad, mouse, trackball, trackpad, and/or cursor direction keys for communicating information and commands to processor 802.

System 800 also includes network interface 812 coupled to the processor 802. Network interface 812 allows system 800 to communicate with network 814, to which one or more other computer systems are connected. Network interface 812 includes wireless network interfaces such as BLUETOOTH, WIFI, WIMAX, GPRS, or WCDMA; or wired network interface such as ETHERNET, USB, or IEEE-1394. In some embodiments, method 500 or method 500' is implemented in two or more systems 800, and information such as pin length, global connection tolerance, blocked tracks and cell location are exchanged between different systems 800 via network 814.

System 800 is configured to receive information related to a pin length of pins in a cell through I/O interface 810 or network interface 812. The information is transferred to processor 802 via bus 808 to place the cell in a circuit layout. The pin length is then stored in computer readable medium 804 as pin length parameter 816. System 800 is configured to determine information related to global connection tolerance during execution of method 500 or method 500' (FIGS. 5A and 5B). In some embodiments, system 800 is configured to receive information related to global connection tolerance through I/O interface 810 or network interface 812. The information is stored in computer readable medium 804 as global connection tolerance parameter 818. System 800 is configured to determine information related to blocked tracks during execution of method 500 or method 500' (FIGS. 5A and 5B). In some embodiments, system 800 is configured to receive information related to blocked tracks through I/O interface 810 or network interface 812. The information is stored in computer readable medium 804 as blocked tracks parameter 820. System 800 is configured to receive information related to cell location through I/O interface 810 or network interface 812. In some embodiments, system is configured to determine information related to cell location during execution of method 500 or method 500' (FIGS. 5A and 5B). The information is stored in computer readable medium 804 as cell location parameter 822.

System 800 is a specific purpose computing device which is configured for executing method 500 or method 500' (FIGS. 5A and 5B). While system 800 may include components which are usable in other computing devices, system 800 is configured for the specific purpose of executing a method of global connection routing.

One aspect of this description relates to a method of global connection routing. The method includes determining a global connection tolerance of a cell for use in a circuit layout, wherein the cell comprises a plurality of pins, and a plurality of routing tracks are defined with respect to the cell. The method further includes determining a number of blocked tracks within the cell. The method further includes comparing the global connection tolerance with the number of blocked tracks. The method further includes adjusting a location of the cell within the circuit layout if the global connection tolerance and the number of blocked tracks fail to satisfy a predetermined condition.

Another aspect of this description relates to a system for implementing a global connection routing method. The system includes at least one processor, and a non-transitory computer readable medium configured to store instructions and/or program data. The non-transitory computer readable medium is connected to the at least one processor, and the at least one processor is configured to execute the stored instructions. The at least one processor is configured to determine a global connection tolerance of a cell for use in a circuit layout, wherein the cell comprises a plurality of pins, and a plurality of routing tracks are defined with respect to the cell. The at least one processor is configured to determine a number of blocked tracks within the cell. The at least one processor is configured to compare the global connection tolerance with the number of blocked tracks. The at least one processor is configured to adjust a location of the cell within the circuit layout if the global connection tolerance and the number of blocked tracks fail to satisfy a predetermined condition.

Still another aspect of this description relates to a method of modifying a cell. The method includes identifying a number of pins in a maximum overlapped pin group of the cell, determining a number of routing tracks in a span region, and determining the global connection tolerance K of the cell. The method further includes determining whether the global connection tolerance K satisfies a threshold value. The method further includes modifying a length of at least one pin or a location of at least one pin in the cell if the global connection tolerance K fails to satisfy the threshold value.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of global connection routing, the method comprising:

determining a global connection tolerance of a cell for use in a circuit layout, wherein the cell comprises a plurality of pins, and a plurality of routing tracks are defined with respect to the cell;

determining a number of blocked tracks of the plurality of routing tracks within the cell;

comparing the global connection tolerance with the number of blocked tracks;

adjusting a location of the cell within the circuit layout in response to the comparison of the global connection tolerance and the number of blocked tracks failing to satisfy a predetermined condition; and fabricating a mask based on the adjusted location of the cell.

2. The method of claim 1, wherein the determining of the global connection tolerance comprises:

identifying a first routing track of the plurality of routing tracks closest to a first edge of the cell usable for connecting to a first pin of the plurality of pins;

identifying a second routing track of the plurality of routing tracks closest to a second edge of the cell usable for connecting to a second pin of the plurality of pins, wherein the second edge is opposite the first edge; and identifying a number of pins in the plurality of pins.

3. The method of claim 2, wherein the determining of the global connection tolerance comprises:

determining the global connection tolerance based on a number of pins in a maximum overlapped pin group and a number of routing tracks intersected by the pins in the maximum overlapped pin group.

4. The method of claim 1, further comprising adjusting a length of at least one pin of the plurality of pins in the cell in response to the global connection tolerance being below a threshold value.

5. The method of claim 4, further comprising determining a global connection tolerance of the cell including the at least one pin having the adjusted length.

6. The method of claim 1, further comprising adjusting the location of the cell in the circuit layout in response to the global connection tolerance being below a threshold value.

7. The method of claim 6, further comprising determining a number of blocked tracks of the cell having the adjusted location.

8. The method of claim 1, wherein the determining of the number of blocked tracks of the cell comprises identifying a number of the plurality of routing tracks which are blocked by interconnect structures located in a metal level above the cell.

9. The method of claim 8, wherein the identifying of the number of the plurality of routing tracks blocked by interconnect structures comprises identifying the number of the plurality of routing tracks blocked by power-ground (PG) lines.

10. The method of claim 1, wherein the comparing of the global connection tolerance to the number of blocked tracks comprises determining in response to the global connection tolerance being less than the number of blocked tracks.

11. The method of claim 1, wherein the comparing of the global connection tolerance to the number of blocked tracks comprises determining in response to the global connection tolerance being less than the number of blocked tracks increased by a buffer factor.

12. The method of claim 1, further comprising adjusting a length of at least one pin of the plurality of pins and adjusting a location of the at least one pin.

13. The method of claim 4, wherein the adjusting of the length of the at least one pin comprises adjusting a length of more than one pin of the plurality of pins.

14. The method of claim 1, wherein the determining of the global connection tolerance of the cell comprises determining the global connection tolerance of the cell in a one-dimensional routing scheme.

15. The method of claim 1, further comprising fabricating a mask based on the modified length of the at least one pin or the position of the at least one pin in the cell.

16. A system for implementing a global connection routing method, the system comprising:

at least one processor; and a non-transitory computer readable medium configured to store instructions, wherein the non-transitory computer readable medium is connected to the at least one processor, and the at least one processor is configured to execute the stored instructions for:

determining a global connection tolerance of a cell for use in a circuit layout, wherein the cell comprises a plurality of pins, and a plurality of routing tracks are defined with respect to the cell;

determining a number of blocked tracks of the plurality of routing tracks within the cell;

comparing the global connection tolerance with the number of blocked tracks;

adjusting a location of the cell within the circuit layout in response to the comparison of the global connection tolerance and the number of blocked tracks failing to satisfy a predetermined condition; and fabricating a mask based on the circuit layout including the adjusted location of the cell.

17. The system of claim 16, wherein the at least one processor is configured to execute the stored instructions for determining the global connection tolerance by:

identifying a first routing track of the plurality of routing tracks closest to a first edge of the cell usable for connecting to a first pin of the plurality of pins;

identifying a second routing track of the plurality of routing tracks closest to a second edge of the cell usable for connecting to a second pin of the plurality of pins, wherein the second edge is opposite the first edge; and identifying a number of pin in the plurality of pins.

18. The system of claim 16, wherein the at least one processor is configured to execute the stored instructions for:

adjusting a length of at least one pin of the plurality of pins in response to the global connection tolerance being below a threshold value.

19. The system of claim 16, wherein the at least one processor is configured to execute the stored instructions for:

adjusting the location of the cell in response to the global connection tolerance and the number of blocked tracks failing to satisfy a predetermined condition.

20. A method of modifying a cell, the method comprises:

identifying a number of pins in a maximum overlapped pin group;

determining a number of routing tracks in a span region covering the maximum overlapped pin group;

determining the global connection tolerance of the cell based on the number of pins in the maximum overlapped pin group and the number of routing tracks in the span region;

determining whether the global connection tolerance satisfies a threshold value;

modifying a length of at least one pin or a position of at least one pin in the cell in response to the global connection tolerance failing to satisfy the threshold value; and fabricating a mask based on the modified length of the at least one pin or the position of the at least one pin in the cell.

* * * * *